Figure 1:
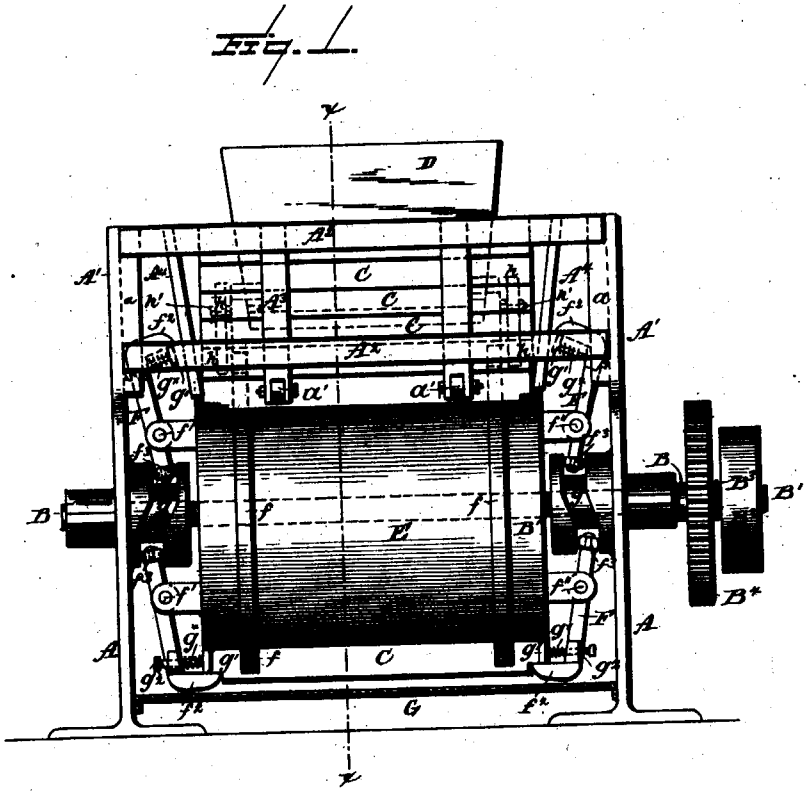

2 Sheets—Sheet 1.

A. NAYLOR.

Assignor to A. H. NEWTON.

BRICK MOLD SANDER.

No. 10,976. Reissued Dec. 25, 1888.

Witnesses:
Louis C. Hills,
W. S. Duvall

Inventor
Arthur Naylor.
E. B. Stoughton
Attorney.

N. PETERS, Photo-Lithographer, Washington, D. C.

A. NAYLOR.
Assignor to A. H. NEWTON.
BRICK MOLD SANDER.
No. 10,976. Reissued Dec. 25, 1888.
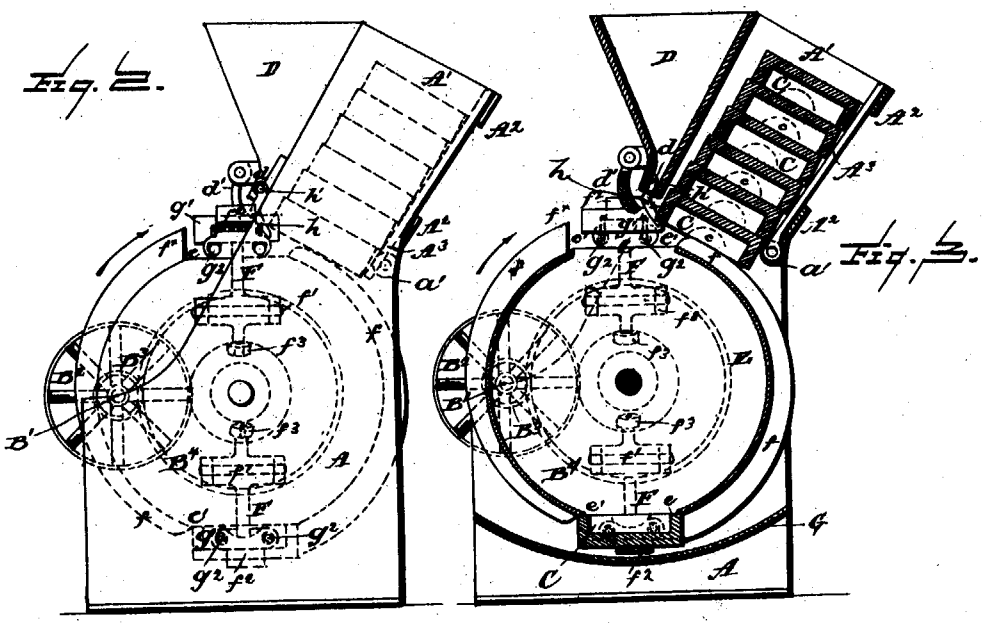
Witnesses:
Louis C. Stiles,
W. S. Duvall.
Inventor,
Arthur Naylor.
E. B. Stocking
Attorney
N. PETERS, Photo-Lithographer, Washington, D.C.

UNITED STATES PATENT OFFICE.

ARTHUR NAYLOR, OF COLD SPRING, ASSIGNOR TO ALBERT H. NEWTON, OF COHOES, NEW YORK.

BRICK-MOLD SANDER.

SPECIFICATION forming part of Reissued Letters Patent No. 10,976, dated December 25, 1888.

Original No. 327,711, dated October 6, 1885. Application for reissue filed July 21, 1888. Serial No. 280,659.

*To all whom it may concern:*

Be it known that I, ARTHUR NAYLOR, of Cold Spring, in the county of Putnam and State of New York, have invented a new and useful Improvement in Machines for Sanding Brick-Molds, of which the following is a specification.

My invention relates to machines which are automatic in their operation, it being only necessary to place molds from time to time in a rack or feed-table and to remove the molds one by one from the machine as they are taken one by one from the rack or feed-table and sanded.

In carrying out my invention I employ a hollow cylinder having gaps or apertures extending lengthwise in its circumference and a rack or feed-table, the outlet from which is located at the periphery of the cylinder. This cylinder I provide with cam-shaped flanges extending circumferentially between the openings or apertures of the cylinder, and having a greater projection at one end than the other. These flanges do not extend across the openings or apertures in the cylinder. As the cylinder rotates, these flanges support the pile of molds in the rack or feed-table, and when an opening or aperture comes opposite the pile of molds the lower mold falls thereinto and is locked and held firmly, so as to cover the opening or aperture by means of catches or hooks with which the cylinder is provided, and which are operated to clamp and release the molds by means of suitable cams. The cylinder contains a proper quantity of sand, which is automatically replenished from a hopper, and the molds being held firmly in place over the cylinder openings or apertures with their open faces inward the sand fills the molds as they are successively carried around the cylinder.

The invention consists in novel combinations of parts, which are hereinafter described, and pointed out in the claims, and which are illustrated in the accompanying drawings.

In the drawings, Figure 1 is an elevation of a machine embodying my invention, an apron or concave support for sand which may fall from the cylinder being shown in section. Fig. 2 is an end elevation of the machine; and Fig. 3 is a transverse vertical section on the plane of the dotted lines $x\ x$, Fig. 1.

Similar letters of reference designate corresponding parts in all the figures.

A designates upright standards or end frames wherein is journaled a shaft, B. This shaft may be driven by any suitable mechanism. I have here shown for that purpose a short counter-shaft, B′, on which are a belt-pulley, $B^2$, and pinion $B^3$ gearing into a wheel, $B^4$, on the shaft B. The end frames have upwardly-extending portions, A′, on which are cast flanges $a$, and to these flanges are bolted cross-rails or stretchers $A^2$. (Shown in Fig. 1.) To the rails $A^2$ are attached pieces $A^3$, which are inclined, as shown in Fig. 3, and are provided at their lower ends with rollers $a'$, for a purpose hereinafter described, and inward of the end frames, A A′, are inclined pieces or bars $A^4$. By the rails and bars described I form a rack or feed-table, wherein or whereon may be placed molds C, and the pile of molds rests against the pieces $A^3$ and gravitates downward as the mold which is lowermost is removed from time to time. At the front of the rack or feed-table for molds is a sand-hopper, D, which has a small or narrow mouth, $d$, closed by a hinged door or valve, $d'$. (Best shown in Fig. 3.)

To the shaft B is secured a cylinder, E, which may be of cast metal, and is closed at the ends and periphery save for openings or apertures $e$, which extend lengthwise of its periphery. Of course only a single opening or aperture, $e$, might be provided; but two or more are preferable. The cylinder E also has upon its periphery circumferential flanges $f$, which are removed or omitted at the openings $e$ and stop a little short of the openings, as best shown in Fig. 3. The edges of the cylinder at these openings and the ends of the cylinder form rests or seats $e'$ for the molds C, one mold being represented at the lower part of the cylinder as covering and closing the opening $e$. The flanges or ribs $f$ are eccentric or cam-shaped, as best shown in Fig. 3, and as the cylinder turns in the direction indicated by the arrow in Fig. 3 those ends $f^*$ of the flanges or ribs $f$ which are forward or in front are considerably deeper or have more projection than the rear ends of said flanges or ribs. As the cylinder rotates, the flanges or ribs $f$ support the pile of molds C, and as they are cam-shaped, as described, the pile is gradually let down or falls until the gap between the flanges is coincident with the pile, whereupon the lowermost mold of the pile descends into the gap between the flanges and over the opening or aperture $e$. As the mold is carried round by the cylinder, the sand with which the cylinder is partly filled fills the mold, and when the mold is carried upward again the sand falls out of it and into the cylinder. The mold is intended to be removed before the gap between the flanges $f$ reaches its uppermost position; and hence the molds $e'$ will be vacant as they reach the pile of molds, and each in succession will take a new or unsanded mold.

In order to retain the molds in their seats $e'$, I employ catches or hooks, which may consist of levers F, fulcrumed at $f'$ to the ends of the cylinder E, and having hook-shaped outer ends, $f^2$, as shown in Fig. 1. The inner ends of these levers are provided with rollers $f^3$, which engage cam-grooves $g$, formed in hubs projecting inward from the end standards, A, as shown in Fig. 1, and which are therefore stationary.

As the molds after being sanded are brought to the position where they are to be removed, the catches or holding-hooks $f^2$ are drawn back or retracted, as shown in Fig. 1, by the action of the cams $g$, and as the molds are taken from the pile the catches or hooks $f^2$ are by the action of the same cams caused to grip the molds and to secure them in place until released.

Brick-molds are commonly cut away at the ends to form handles, as indicated by dotted lines at $c$ in Fig. 3, and in order to prevent sand from running out of these cavities when the molds pass the lowermost position of the cylinder I provide the catches or holding-hooks $f^2$ with guard-plates $g'$, which are attached to small rods $g^2$, working through eyes or lugs on the catches or hooks, as best shown in Fig. 1. Upon these rods $g^2$ are spiral springs $g^*$, and when the catches or hooks are closed on a mold the plates $g'$ are pressed by the said springs against the ends of the mold, and thereby close the openings in their ends. The springs and movable guard-plates enable the guard-plates to accommodate themselves readily to slight variations in the length of the molds.

In Fig. 3 I have represented the parts in the position which they occupy just as the mold-seat $e'$ is coming to a position under the pile of molds C, and it will be understood that as the rear ends of the flanges or ribs $f$ pass the rear edges of the lower mold that mold will drop thereonto, the rollers $a'$ turning to permit it, and the ends $f^*$ of the next pair of flanges striking the mold will carry it forward, the catches or hooks $f^2$ being at the same time actuated to catch and hold the mold in place.

The rollers $a'$ turn to permit the lower mold to drop onto the seat $e'$, as just stated, and they reduce the friction of the lower mold in case all in the rack or feed-table are lifted, as described, and as said rollers project slightly beyond the face of the rack or feed-table they catch and hold from dropping the rear side of the next to the lowest mold in the series on the rack or feed-table, and they perform another advantageous function, in forcing the rear side of each mold away from the rack or feed-table and prevent its being stuck to the same by the accumulation of clay thereon.

In case the machine attendant neglects to remove the mold, the mold will pass on around with the cylinder, and to avoid collision between it and the lowermost mold of the pile I arrange at the front of the mold-rack or feed-table knee-shaped retainers $h$, which are pivoted at $h'$, and hold up the front edges of the lowest mold of the pile, but do not in any way prevent its dropping at the rear edge when an empty mold-seat comes opposite the pile. In case the sanded mold has not been removed it will strike the inclined lower ends of the retainers $h$, and by raising them will lift the pile of molds, so as to permit it to pass below them; hence no breakage or accident can occur by reason of a workman neglecting to take a sanded mold from the machine.

When the machine is started, the cylinder E is partly filled with sand; but there is considerable waste through the vent-holes of the molds in addition to the sand which adheres to the molds, and it is my design to supply the sand automatically from the hopper D as the cylinder rotates. The valve or door $d'$ of the hopper is held up by the flanges or ribs $f$ to close the mouth thereof; but as the gap between the flanges reaches the position shown in Fig. 3 the flanges $f$ release the door, and it drops, as shown in Fig. 3, and allows a small quantity of sand to escape into the cylinder. As soon as the forward ends of the flanges or ribs $f$ strike the door, they raise it, and if the mold has not been removed it will prevent the door or valve from swinging open and any sand from escaping.

G designates an apron or catch-plate arranged just below the cylinder, or so that the cylinder, with its catches and a mold, will just clear it. The apron or plate G catches sand, and as the mold passes it will have its exterior more or less sanded, so that there will be no clay exposed thereon.

I am aware that in machines for sanding brick-molds it is common to employ a hollow drum or cylinder having openings at different points in its circumference, over which the molds may be placed. I am also aware that in such machines the molds have been held close against the cylinder-openings, as they are carried around the lower portion of the cylinder by means of a concave bed consisting of a number of rollers, and by means of endless bands passed over suitable guide-pulleys and deflected around the lower portion of the cylinder and its attached molds. I am also aware that in such machines the cylinders have been provided at opposite edges of their openings with overhanging flanges for confining molds opposite the openings, such molds being introduced endwise into place under the flanges and over the openings.

I am also aware that it is not new in a machine for the purpose above described to take the molds automatically by the cylinder from the rack or feed-table wherein a pile of molds are placed, and in that machine a cylinder was provided with shoes near opposite ends, extending between the openings and serving to remove the lowermost mold of the pile, and to support the remaining molds until such time as the next opening in the cylinder comes opposite the pile of molds. In that machine, however, the faces of the convex shoes of the cylinder were concentric with the axis of revolution and did not gradually lower the pile of molds as they pass under it, in order to bring the lowermost mold of the pile more within range of the ends of the shoes which follow as the cylinder rotated.

I do not desire to include in my invention any of the constructions above referred to. In my machine the flanges or ribs which extend circumferentially between the openings of the cylinder are cam-shaped at their outer edges or circumference, and have a much greater projection from the cylinder at their forward ends than at their rear ends. Consequently as these flanges or ribs pass under the pile of molds they allow the molds to gradually descend, so as to bring the lowermost mold of the pile more within the range of the forward ends of the next succeeding ribs or flanges. In my machine the circumferential ribs or flanges of the cylinder also serve to maintain in closed position the gate or valve of the sand-hopper until such time as an opening in the cylinder comes opposite the hopper, and this I believe to be new in machines for sanding brick-molds.

What I claim as my invention, and desire to secure by Letters Patent, is—

1. The combination, with a cylinder having openings extending lengthwise in its periphery, and having cam-shaped or inclined flanges or ribs extending circumferentially between said openings, the forward ends of said flanges or ribs having a greater projection from the cylinder than the rear ends thereof, of a mold-rack or feed-table wherein the molds are supported by the cam-shaped flanges or ribs, and from which the molds pass into the mold-seats at the openings of the cylinder as the said openings successively pass under the rack or feed-table, substantially as and for the purpose described.

2. The combination, with a rack or feed-table for molds, of a cylinder arranged to rotate under the rack or feed-table, and provided with openings or mold-seats in its periphery, and with cam-shaped flanges or ribs extending circumferentially between said openings, and hinged retainers on the mold-rack, whereby the pile of molds will be lifted in case the sanded molds are not removed from the cylinder, substantially as herein described.

3. The combination, with a mold-rack and a cylinder provided with openings extending lengthwise of its periphery and forming mold-seats, and with cam-shaped flanges extending circumferentially between said openings, and on which the pile of molds in the rack or feed-table rests, of levers pivoted to and carried by the cylinder, and having catches or hooks at their ends for grasping molds and cams, whereby the levers and catches or hooks are operated to grasp and release molds, substantially as herein described.

4. The combination, with the mold rack and cylinder provided with longitudinal openings and mold-seats, and with cam-shaped circumferential flanges or ribs, of a sand-hopper and a hinged door or valve which is held closed by said flanges until an opening in the cylinder is reached, substantially as herein described.

5. The combination, with the cylinder E, having openings and mold-seats $e$ $e'$, and cam-shaped flanges or ribs $f$, of the rack or feed-table, wherein molds will be supported by the said flanges or ribs on the cylinder, the levers F, pivoted to the cylinder, and having at their outer ends hooks or catches $f^2$, and spring-actuated guard-plates $g$, and cams for operating said levers to grasp and release molds, substantially as herein described.

6. The mold-holding levers F, having the guard-plates $g'$, substantially as specified.

7. A mold-rack or feed-table provided with rollers $a'$, arranged and adapted to remove the molds from contact with said rack or feed-table, substantially as specified.

8. The combination, with a mold-rack or feed-table and a cylinder provided with openings extending lengthwise of its periphery and forming mold-seats, and with cam-shaped flanges extending circumferentially between said openings, and on which the lowest mold of the pile of molds in the rack or feed-table rests, of a roller arranged to bear against said lowest mold and to move it from contact with said rack or feed-table, substantially as specified.

ARTHUR NAYLOR.

Witnesses:
HEATH SUTHERLAND,
L. C. HILLS.